United States Patent
Imamura (10) Patent No.: US 9,035,724 B2
(45) Date of Patent: May 19, 2015

(54) MULTILAYER BAND PASS FILTER (71) Applicant: Murata Manufacturing Co., Ltd., Nagaokakyo-shi, Kyoto-fu (JP)

(72) Inventor: Mitsutoshi Imamura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 245 days.

(21) Appl. No.: 13/864,360

(22) Filed: Apr. 17, 2013

(65) Prior Publication Data

US 2013/0229241 A1     Sep. 5, 2013

Related U.S. Application Data (63) Continuation of application No. PCT/JP2011/076983, filed on Nov. 24, 2011.

(30) Foreign Application Priority Data

Dec. 6, 2010   (JP) .................................. 2010-271728

(51) Int. Cl.
H03H 7/01      (2006.01)
H03H 7/09      (2006.01)
H01P 1/203     (2006.01)
H03H 1/00      (2006.01)

(52) U.S. Cl.
CPC .............. H03H 7/0115 (2013.01); H03H 7/09 (2013.01); H03H 7/1708 (2013.01); H03H 7/1725 (2013.01); H03H 7/1775 (2013.01); H03H 2001/0085 (2013.01); H03H 7/1791 (2013.01); H01P 1/20345 (2013.01)

(58) Field of Classification Search
CPC ....... H03H 7/0115; H03H 7/075; H03H 7/09; H03H 7/1791
USPC .................................................... 333/185, 204
See application file for complete search history.

(56) References Cited

U.S. PATENT DOCUMENTS 6,222,427 B1   4/2001  Kato et al.
6,768,399 B2 *  7/2004  Uriu et al. ..................... 333/204

(Continued)

FOREIGN PATENT DOCUMENTS

JP    09-035936 A    2/1997
JP    2000-201001 A  7/2000

(Continued)

OTHER PUBLICATIONS

Official Communication issued in International Patent Application No. PCT/JP2011/076983, mailed on Jan. 24, 2012.

*Primary Examiner* — Dean Takaoka
*Assistant Examiner* — Alan Wong
(74) *Attorney, Agent, or Firm* — Keating & Bennett, LLP (57) ABSTRACT

In a multilayer band pass filter, via-electrodes and strip electrodes define inductors of LC parallel resonators in four stages. A capacitor electrode and a ground electrode define a capacitor of a first-stage LC parallel resonator. A capacitor electrode and the ground electrode define a capacitor of a fourth-stage LC parallel resonator. Capacitor electrodes define a second-stage LC parallel resonator. Capacitor electrodes define a third-stage LC parallel resonator. Among four or more of the LC parallel resonators, the coupling between certain LC parallel resonators is easily defined, and the attenuation characteristic of a filter is definable with a high degree of freedom.

20 Claims, 10 Drawing Sheets

(56) References Cited

U.S. PATENT DOCUMENTS

| | | | |
|---|---|---|---|
| 7,671,706 B2 * | 3/2010 | Taniguchi | 333/203 |
| 8,264,302 B2 * | 9/2012 | Nosaka | 333/175 |
| 8,547,189 B2 * | 10/2013 | Sasaki et al. | 333/185 |
| 8,680,950 B2 * | 3/2014 | Taniguchi | 333/185 |
| 8,754,726 B2 * | 6/2014 | Sasaki et al. | 333/204 |
| 8,847,704 B2 * | 9/2014 | Masuda | 333/175 |
| 2003/0085777 A1 | 5/2003 | Kim et al. | |
| 2007/0241389 A1 | 10/2007 | Ozawa et al. | |
| 2010/0171568 A1 | 7/2010 | Taniguchi | |

FOREIGN PATENT DOCUMENTS

| | | |
|---|---|---|
| JP | 2003-152492 A | 5/2003 |
| JP | 2006-067221 A | 3/2006 |
| JP | 4356803 B2 | 11/2009 |
| WO | 2007/119356 A1 | 10/2007 |
| WO | 2009/041294 A1 | 4/2009 |

* cited by examiner

FIRST PAIR OF LC PARALLEL RESONATORS    102

SECOND PAIR OF LC PARALLEL RESONATORS

FIRST PAIR OF LC PARALLEL RESONATORS      103

SECOND PAIR OF LC PARALLEL RESONATORS

FIRST PAIR OF LC PARALLEL RESONATORS      SECOND PAIR OF LC PARALLEL RESONATORS

MULTILAYER BAND PASS FILTER

BACKGROUND OF THE INVENTION

1. Field of the Invention

The present invention relates to a multilayer filter including a plurality of resonators, each defined by a loop-shaped inductor and a capacitor electrode.

2. Description of the Related Art

Hitherto, a compact and inexpensive high-frequency band pass filter has been constructed by providing a plurality of LC resonators in a multilayer body, which is formed by stacking dielectric layers and electrode layers on top of one another.

Examples of such a multilayer band pass filter are disclosed in Japanese Unexamined Patent Application Publication No. 2006-067221 and International Publication No. WO 2007/119356.

Japanese Unexamined Patent Application Publication No. 2006-067221 discloses, as illustrated in FIG. 1 thereof, a three-stage multilayer filter including a jump-coupling capacitor C3 for achieving capacitive coupling between resonators in the first stage and third stage. Also, as illustrated in FIG. 3 of Japanese Unexamined Patent Application Publication No. 2006-067221, the jump-coupling capacitor C3 is defined by an electrode pattern 151 defining an inductor L1, an electrode pattern 153 defining an inductor L3, and an electrode pattern 161 which faces the electrode patterns 151 and 153.

However, in the configuration according to Japanese Unexamined Patent Application Publication No. 2006-067221, the electrode pattern 161 also faces an electrode pattern 152 defining an inductor L2, and thus an undesirable parasitic capacitance is generated between the electrode pattern 161 and the electrode pattern 152. This causes a problem of decreasing Q of the filter and degrading attenuation characteristics.

On the other hand, International Publication No. WO 2007/119356 discloses a configuration for decreasing a parasitic capacitance between an electrode pattern of a jump-coupling capacitor and a capacitor electrode pattern of an LC parallel resonator which is not coupled to the electrode pattern of the jump-coupling capacitor.

Figure 1:
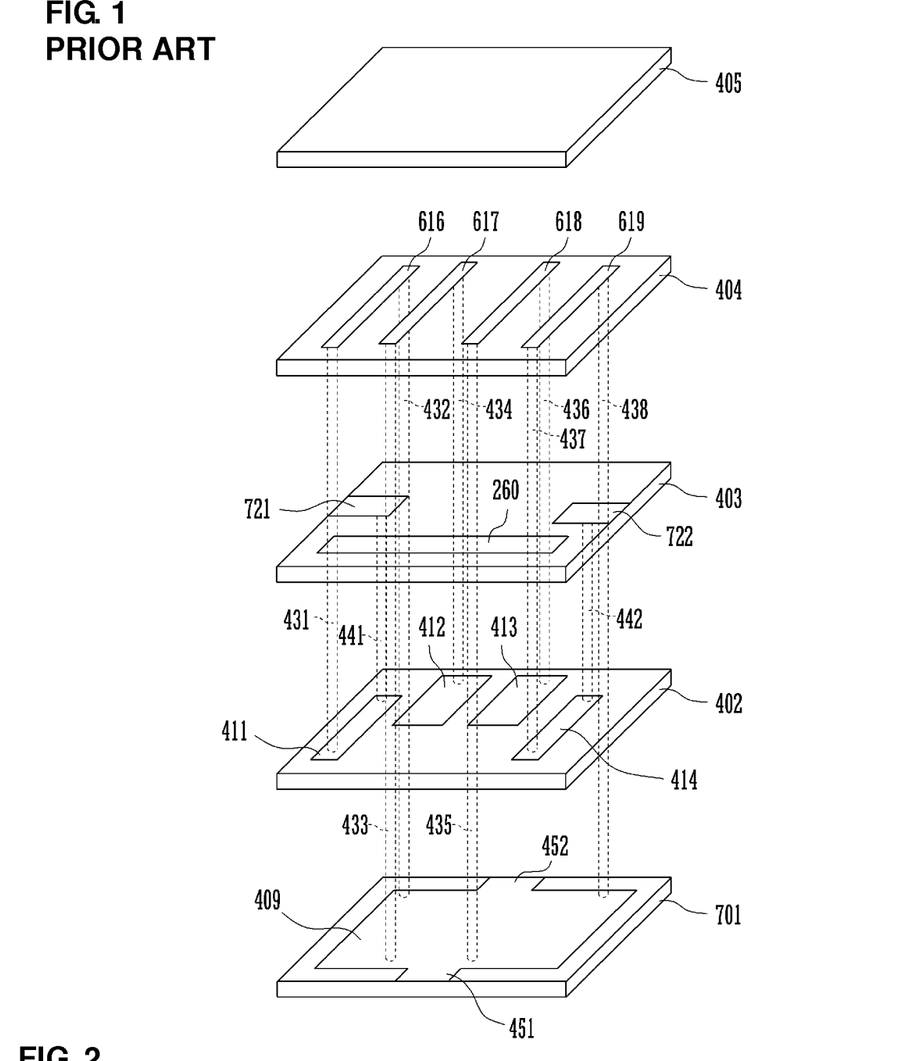
FIG. 1 is an exploded perspective view of a multilayer band pass filter disclosed in International Publication No. WO 2007/119356.

Here, the configuration of a multilayer band pass filter disclosed in International Publication No. WO 2007/119356 is illustrated in FIG. 1. The multilayer band pass filter illustrated in FIG. 1 includes a multilayer body which is defined by a ground electrode formation layer 701, a capacitor electrode formation layer 402, an input/output electrode formation layer 403, a strip electrode formation layer 404, and an external layer 405. The input/output electrode formation layer 403 is provided with an input electrode 721 and an output electrode 722, and an input-output capacitor electrode (an electrode pattern of a jump-coupling capacitor) 260. The input-output capacitor electrode 260 causes a capacitance to be generated between a capacitor electrode 411 connected to the input electrode 721 through via-electrode 441 and a capacitor electrode 414 connected to the output electrode 722 through via-electrode 442, and thereby causes the input electrode and the output electrode to be capacitively coupled to each other. The capacitor electrodes 411, 412, 413, and 414 of the capacitor electrode formation layer 402 face a ground electrode 409 which includes terminals 451 and 452.

To reduce the parasitic capacitance between the input-output capacitor electrode (an electrode pattern of a jump-coupling capacitor) 260 and the capacitor electrode 412 of a second-stage resonator, the capacitor electrodes of second-stage and third-stage resonators are displaced in the surface direction of the multilayer body with respect to the capacitor electrodes of first-stage and fourth-stage resonators.

The capacitor electrode 411, the ground electrode 409, via-electrodes 431 and 432, and a strip electrode 616 define a first-stage LC parallel resonator. The capacitor electrode 412, the ground electrode 409, via-electrodes 433 and 434, and a strip electrode 617 define a second-stage LC parallel resonator. The capacitor electrode 413, the ground electrode 409, via-electrodes 435 and 436, and a strip electrode 618 define a third-stage LC parallel resonator. Furthermore, the capacitor electrode 414, the ground electrode 409, via-electrodes 437 and 438, and a strip electrode 619 define a fourth-stage LC parallel resonator.

Figure 2:
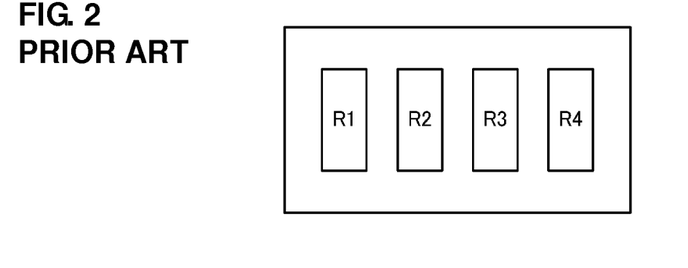
FIG. 2 is a schematic plan view illustrating the positional relationship among four LC parallel resonators of the multilayer band pass filter illustrated in FIG. 1.

FIG. 2 is a schematic plan view illustrating the positional relationship of the four LC parallel resonators of the multilayer band pass filter illustrated in FIG. 1. The first-stage LC parallel resonator R1, the second-stage LC parallel resonator R2, the third-stage LC parallel resonator R3, and the fourth-stage LC parallel resonator R4 are disposed such that all the loop surfaces of the inductor electrodes thereof are parallel with one another.

According to the structure illustrated in FIG. 1, providing loop-shaped inductors produces an effect that the Q characteristics of the LC parallel resonators are improved and that the attenuation characteristics of the filter are improved.

Also, according to the structure illustrated in FIG. 1, the capacitor electrode of the second-stage resonator and the jump-coupling capacitor electrode do not overlap one another in perspective view in the stacking direction of the dielectric layers, and thus the parasitic capacitance therebetween can be decreased.

However, in the structures disclosed in Japanese Unexamined Patent Application Publication No. 2006-067221 and International Publication No. WO 2007/119356, in a case where three or more stages of LC parallel resonators are provided, the LC parallel resonators are disposed in a line such that the loop surfaces of all the LC parallel resonators are parallel with one another. Thus, there is a problem that, though electromagnetic coupling between the inductor electrode of each LC parallel resonator and the inductor electrode of the LC parallel resonator adjacent thereto can be adjusted, it is only possible to slightly adjust (set) electromagnetic coupling between the inductor electrode of the LC parallel resonator in the input stage and the inductor electrode of the LC parallel resonator in the output stage. This causes a problem that the degree of freedom of adjusting (setting) the attenuation characteristics of the filter (particularly, the position and band of an attenuation pole) is low.

SUMMARY OF THE INVENTION

Preferred embodiments of the present invention provide a multilayer band pass filter in which electromagnetic coupling between inductor electrodes of certain LC parallel resonators among four or more stages of LC parallel resonators can be easily defined, and the attenuation characteristics of the filter can be defined at a high degree of freedom.

A multilayer band pass filter according to the present application is defined by a multilayer body including a plurality of dielectric layers and a plurality of electrode layers, the plurality of electrode layers defining a first capacitor electrode, a second capacitor electrode which faces the first capacitor electrode, and a loop-shaped inductor electrode which includes a first end and a second end, the first end being connected to the first capacitor electrode, the second end being connected to the second capacitor electrode, the first end serving as a start point of the loop-shaped inductor electrode, and the second end serving as an end point of the loop-shaped inductor electrode, the inductor electrode being defined by strip electrodes which are arranged along the dielectric layers and via-electrodes which extend in a stacking direction of the dielectric layers, the first capacitor electrode, the second capacitor electrode, and the inductor electrode defining an LC parallel resonator, the multilayer band pass filter including a plurality of LC parallel resonators, each being the LC parallel resonator, the plurality of LC parallel resonators including four or more LC parallel resonators, wherein the plurality of LC parallel resonators define a plurality of pairs of LC parallel resonators, each of the pairs is defined by adjacent LC parallel resonators whose loop surfaces of the inductor electrodes face each other at least partially, and the pairs are arranged in a direction parallel or substantially parallel to the loop surfaces.

With this configuration, the degree of freedom of adjusting jump magnetic coupling and capacitive coupling between LC parallel resonators which are not adjacent to each other in an equivalent circuit increases. Accordingly, the degree of freedom of designing the attenuation characteristic of the filter also increases.

Preferably, for example, the pairs of LC parallel resonators are arranged adjacent to one another in a line in an arrangement direction of the pairs of LC parallel resonators. With this structure, no conductor pattern is arranged between adjacent pairs of LC parallel resonators, and thus the coupling between the adjacent pairs of LC parallel resonators can be set more easily.

Preferably, for example, in two adjacent pairs of LC parallel resonators among the plurality of pairs of LC parallel resonators, loop surfaces of the inductor electrodes of one LC parallel resonator in one of the two adjacent pairs and one LC parallel resonator in the other pair face each other at least partially. With this structure, the strength of coupling between the adjacent pairs of LC parallel resonators is significantly increased.

Preferably, for example, in two adjacent pairs of LC parallel resonators among the plurality of pairs of LC parallel resonators, a distance between the LC parallel resonators in one of the two adjacent pairs is different from a distance between the LC parallel resonators in the other pair. With this structure, the coupling between the adjacent pairs of LC parallel resonators can be adjusted easily.

Preferably, for example, in two adjacent pairs of LC parallel resonators among the plurality of pairs of LC parallel resonators, a distance between the LC parallel resonators in one of the two adjacent pairs is the same as a distance between the LC parallel resonators in the other pair, and in the adjacent pairs of LC parallel resonators, loop surfaces of the inductor electrodes of one LC parallel resonators are arranged on the same plane, and loop surfaces of the inductor electrodes of the other LC parallel resonators are arranged on the same plane.

Preferably, for example, the plurality of pairs of LC parallel resonators include a first pair of LC parallel resonators and a second pair of LC parallel resonators, two LC parallel resonators of the first pair are coupled to each other to define a first-stage LC parallel resonator and a second-stage LC parallel resonator in an equivalent circuit, two LC parallel resonators of the second pair are coupled to each other to define a third-stage LC parallel resonator and a fourth-stage LC parallel resonator in the equivalent circuit, and two LC parallel resonators arranged in one line in an arrangement direction of the two pairs of LC parallel resonators are LC parallel resonators in stages which are not adjacent to each other in the equivalent circuit, and two LC parallel resonators arranged in the other line in the arrangement direction of the two pairs of LC parallel resonators are LC parallel resonators in stages which are not adjacent to each other in the equivalent circuit. With this configuration, jump inductive coupling and capacitive coupling between LC parallel resonators in stages which are not adjacent to each other in an equivalent circuit (e.g., the first stage and the third stage, and the first stage and the fourth stage) can be easily achieved.

Preferably, for example, the two LC parallel resonators arranged in the one line in the arrangement direction of the two pairs of LC parallel resonators are coupled to each other, and the two LC parallel resonators arranged in the other line in the arrangement direction of the two pairs of LC parallel resonators are coupled to each other. With this configuration, jump inductive coupling and capacitive coupling between LC parallel resonators in stages which are not adjacent to each other in an equivalent circuit can be easily achieved.

According to preferred embodiments of the present invention, a multilayer band pass filter can be configured in which coupling between certain LC parallel resonators among four or more stages of LC parallel resonators is easily provided, and the attenuation characteristic of the filter is defined at a high degree of freedom.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A multilayer band pass filter according to a first preferred embodiment of the present invention will be described with reference to FIGS. 3 to 7.

Figure 3:
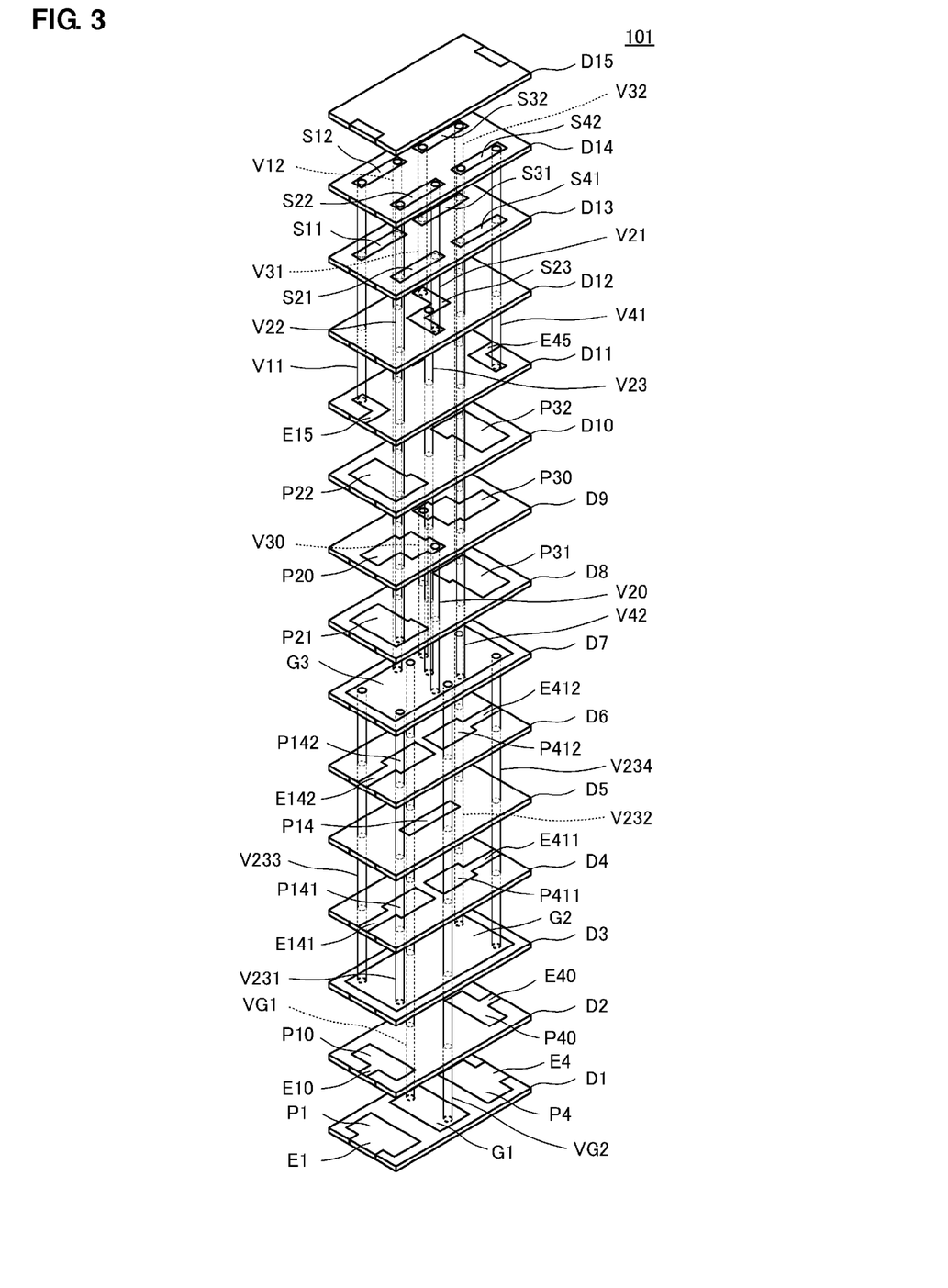
FIG. 3 is an exploded perspective view of a multilayer band pass filter 101 according to a first preferred embodiment of the present invention.
Figure 4:
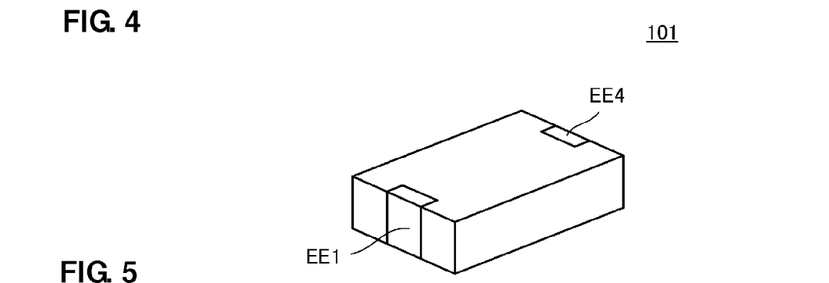
FIG. 4 is an external perspective view of the multilayer band pass filter 101.

FIG. 3 is an exploded perspective view of a multilayer band pass filter 101 according to the first preferred embodiment of the present invention, and FIG. 4 is an external perspective view of the multilayer band pass filter 101.

The multilayer band pass filter 101 is preferably defined by four stages of LC parallel resonators. The first-stage LC parallel resonator is connected to an input terminal, and the fourth-stage LC parallel resonator is connected to an output terminal. The second-stage LC parallel resonator and the third-stage LC parallel resonator are not connected to any of the input terminal and the output terminal. The circuit configuration of the multilayer band pass filter 101 will be described in detail below.

As illustrated in FIG. 3, the multilayer band pass filter 101 is preferably provided by a multilayer body including a plurality of dielectric layers D1 to D15. A ground electrode G3 is arranged on an upper surface of the dielectric layer D7 and is connected to another ground electrode G1 on the dielectric layer D1 through via-electrodes VG1 and VG2. Strip electrodes S11 and S12 are arranged on upper surfaces of the dielectric layers D13 and D14, respectively. Also, strip electrodes S41 and S42 are arranged on the upper surfaces of the dielectric layers D13 and D14, respectively.

Lead electrodes E15 and E45 are preferably arranged on the dielectric layer D11. Via-electrodes V11 and V41 are arranged in the dielectric layers D12 to D14 in the stacking direction of these dielectric layers. Also, via-electrodes V12 and V42 are arranged in the dielectric layers D8 to D14 in the stacking direction of these dielectric layers.

First ends of the strip electrodes S11 and S12 are preferably connected to the lead electrode E15 via the via-electrode V11. Second ends of the strip electrodes S11 and S12 are connected to the ground electrode G3 via the via-electrode V12. The via-electrodes V11 and V12 and the strip electrodes S11 and S12 constitute a loop-shaped inductor of the first-stage LC parallel resonator.

Likewise, first ends of the strip electrodes S41 and S42 are connected to the lead electrode E45 via the via-electrode V41. Second ends of the strip electrodes S41 and S42 are connected to the ground electrode G3 via the via-electrode V42. The via-electrodes V41 and V42 and the strip electrodes S41 and S42 define a loop-shaped inductor of the fourth-stage LC parallel resonator.

A ground electrode G2 is arranged on the dielectric layer D3. The ground electrode G2 is electrically connected to the ground electrode G3 on the dielectric layer D7 via via-electrodes V231, V232, V233, and V234. A capacitor electrode P10 is arranged on the dielectric layer D2. The capacitor electrode P10 and the ground electrode G2 define the capacitor of the first-stage LC parallel resonator. Likewise, a capacitor electrode P40 is arranged on the dielectric layer D2. The capacitor electrode P40 and the ground electrode G2 define the capacitor of the fourth-stage LC parallel resonator.

The lead electrodes E15 and E45 on the dielectric layer D11 are electrically connected to lead electrodes E10 and E40 on the dielectric layer D2 via end-surface electrodes (i.e., electrodes EE1 and EE4 illustrated in FIG. 4). Accordingly, the inductor of the first-stage LC parallel resonator and the capacitor of the first-stage LC parallel resonator are connected to each other in parallel such that the first-stage LC parallel resonator is defined. Likewise, the inductor of the fourth-stage LC parallel resonator and the capacitor of the fourth-stage LC parallel resonator are connected to each other in parallel such that the fourth-stage LC parallel resonator is defined.

Capacitor electrodes P141 and P411 are preferably arranged on the dielectric layer D4. Capacitor electrodes P142 and P412 are arranged on the dielectric layer D6. A capacitor electrode P14 is arranged on the dielectric layer D5. A jump-coupling capacitor is arranged between the capacitor electrode P14 and the capacitor electrodes P141, P142, P411, and P412 on the upper and lower sides.

Lead electrodes E141 and E142 of the capacitor electrodes P141 and P142 are electrically connected to the lead electrode E15 via the end-surface electrode. Likewise, lead electrodes E411 and E412 of the capacitor electrodes P411 and P412 are electrically connected to the lead electrode E45 via end-surface electrode. Accordingly, the first-stage LC parallel resonator and the fourth-stage LC parallel resonator are connected to each other via the jump-coupling capacitor defined by the capacitor electrodes P141, P142, P411, P412, and P14.

Capacitor electrodes P20 and P30 are preferably arranged on the dielectric layer D9. Via-electrodes V20 and V30 are arranged in the dielectric layers D8 and D9. The ground electrode G3 is connected to the capacitor electrodes P20 and P30 via the via-electrodes V20 and V30. Capacitor electrodes P21 and P31 are preferably arranged on the dielectric layer D8. Capacitor electrodes P22 and P32 are preferably arranged on the dielectric layer D10. The capacitor electrode P20 is disposed so as to be sandwiched between the capacitor electrodes P21 and P22 via the dielectric layers D9 and D10. Likewise, the capacitor electrode P30 is disposed so as to be sandwiched between the capacitor electrodes P31 and P32 via the dielectric layers D9 and D10.

The capacitor electrodes P20, P21, P22, and the ground electrode G3 define the capacitor of the second-stage LC parallel resonator. Likewise, the capacitor electrodes P30, P31, P32, and the ground electrode G3 define the capacitor of the third-stage LC parallel resonator.

Strip electrodes S21 and S22 are preferably arranged on upper surfaces of the dielectric layers D13 and D14, respectively. A crank-shaped (i.e., z-shaped) strip electrode S23 is preferably arranged on the dielectric layer D12.

A via-electrode V21 is preferably arranged in the dielectric layers D13 and D14 in the stacking direction of these dielectric layers. First ends of the strip electrodes S21 and S22 are connected to a first end of the crank-shaped strip electrode S23 via the via-electrode V21. A via-electrode V22 is arranged in the dielectric layers D9 to D14 in the stacking direction of these dielectric layers. Second ends of the strip electrodes S21 and S22 are connected to the capacitor electrodes P21 and P22 via the via-electrode V22.

The via-electrodes V21 and V22 and the strip electrodes S21 and S22 define the inductor of the second-stage LC parallel resonator.

Likewise, strip electrodes S31 and S32 are preferably arranged on upper surfaces of the dielectric layers D13 and D14, respectively. A via-electrode V31 is arranged in the dielectric layers D13 and D14 in the stacking direction of these dielectric layers. First ends of the strip electrodes S31 and S32 are connected to a second end of the crank-shaped strip electrode S23 through the via-electrode V31. A via-electrode V32 is arranged in the dielectric layers D9 to D14 in the stacking direction of these dielectric layers. Second ends of the strip electrodes S31 and S32 are connected to the capacitor electrodes P31 and P32 through the via-electrode V32.

The via-electrodes V31 and V32 and the strip electrodes S31 and S32 define the inductor of the third-stage LC parallel resonator.

Accordingly, the inductor of the second-stage LC parallel resonator and the capacitor of the second-stage LC parallel resonator are connected to each other in parallel such that the second-stage LC parallel resonator is defined. Likewise, the inductor of the third-stage LC parallel resonator and the capacitor of the third-stage LC parallel resonator are connected to each other in parallel such that the third-stage LC parallel resonator is defined.

A midpoint of the crank-shaped strip electrode S23 arranged on the dielectric layer D12 is preferably connected to the ground electrode G3 on the dielectric layer D7 through a via-electrode V23.

On an upper surface of the dielectric layer D1, electrodes P1 and P4 (which include respective lead electrodes E1 and E4) whose potential is the same as that of the capacitor electrodes P10 and P40, and an electrode G1 whose potential is the same as that of the ground electrode G2 are defined. On a lower surface of the dielectric layer D1, an electrode pad which is electrically connected to the electrodes P1, P4, and G1 is provided. That is, the electrode pad of the multilayer band pass filter according to this preferred embodiment is preferably formed using, for example, an LGA (Land Grid Array) method.

The dielectric layer portion of the above-described layers is preferably made of, for example, low temperature co-fired ceramic (LTCC) whose dielectric constant is preferably in the range of about 6 or more and about 80 or less. The relative dielectric constant of the dielectric layer which is stacked on an electrode layer including the strip electrode is preferably in the range of about 6 or more and about 80 or less. The relative dielectric constant of the dielectric layer on which a capacitor electrode is arranged is preferably about 20 or more. Each dielectric layer is preferably made using low temperature co-fired ceramic which includes a glass component and at least one of components including titanium oxide, barium oxide, and alumina, for example. The material of each dielectric layer is preferably the same in the other preferred embodiments described below.

Figure 5:
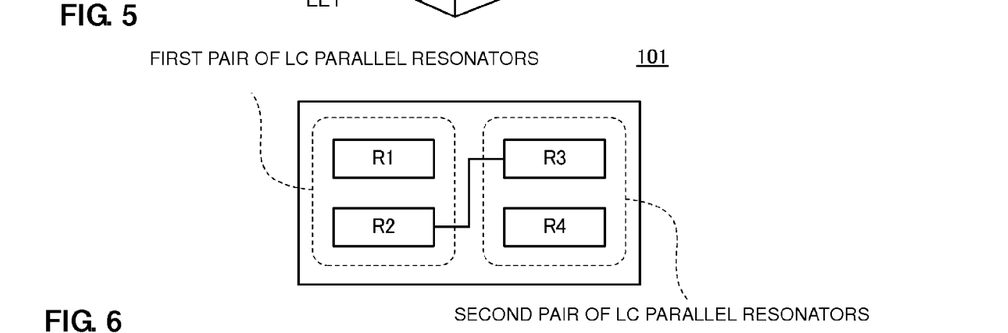
FIG. 5 is a schematic plan view illustrating the positional relationship among four LC parallel resonators of the multilayer band pass filter 101 illustrated in FIG. 3.

FIG. 5 is a schematic plan view illustrating the positional relationship among the four LC parallel resonators of the multilayer band pass filter 101 illustrated in FIG. 3. The first-stage LC parallel resonator R1 and the second-stage LC parallel resonator R2 define a first pair of LC parallel resonators, in which the loop surfaces of the individual inductor electrodes face each other at least partially. Also, the third-stage LC parallel resonator R3 and the fourth-stage LC parallel resonator R4 define a second pair of LC parallel resonators, in which the loop surfaces of the individual inductor electrodes face each other at least partially. The first pair of LC parallel resonators and the second pair of LC parallel resonators are arranged adjacent to each other in a line (in the lateral direction in FIG. 5). That is, there is no LC parallel resonator between the first pair of LC parallel resonators and the second pair of LC parallel resonators.

Regarding the first pair of LC parallel resonators and the second pair of LC parallel resonators, the distances between the LC parallel resonators defining the individual pairs (e.g., the distance between the first-stage LC parallel resonator R1 and the second-stage LC parallel resonator R2, and the distance between the third-stage LC parallel resonator R3 and the fourth-stage LC parallel resonator R4) are the same. Also, in the adjacent pairs of LC parallel resonators, the loop surfaces of the inductor electrodes of one LC parallel resonators (the first-stage LC parallel resonator R1 and the third-stage LC parallel resonator R3) are arranged on the same plane. Furthermore, the loop surfaces of the inductor electrodes of the other LC parallel resonators in the adjacent pairs (the second-stage LC parallel resonator R2 and the fourth-stage LC parallel resonator R4) are arranged on the same plane.

The second-stage LC parallel resonator R2 and the third-stage LC parallel resonator R3 are preferably coupled to each other via the inductor defined by the crank-shaped strip electrode S23 and the via-electrode V23 illustrated in FIG. 3.

The two LC parallel resonators in the first pair (the first-stage LC parallel resonator and the second-stage LC parallel resonator) are preferably coupled to each other to define the first-stage LC parallel resonator and the second-stage LC parallel resonator in an equivalent circuit. The two LC parallel resonators in the second pair are preferably coupled to each other to define the third-stage LC parallel resonator and the fourth-stage LC parallel resonator in the equivalent circuit. The two LC parallel resonators arranged in one line in the arrangement direction of the two pairs of LC parallel resonators (the first-stage LC parallel resonator R1 and the third-stage LC parallel resonator R3) are LC parallel resonators in stages which are not adjacent to each other in the equivalent circuit. Also, the two LC parallel resonators arranged in the other line in the arrangement direction of the two pairs of LC parallel resonators (the second-stage LC parallel resonator R2 and the fourth-stage LC parallel resonator R4) are LC parallel resonators in stages which are not adjacent to each other in the equivalent circuit.

Figure 6:
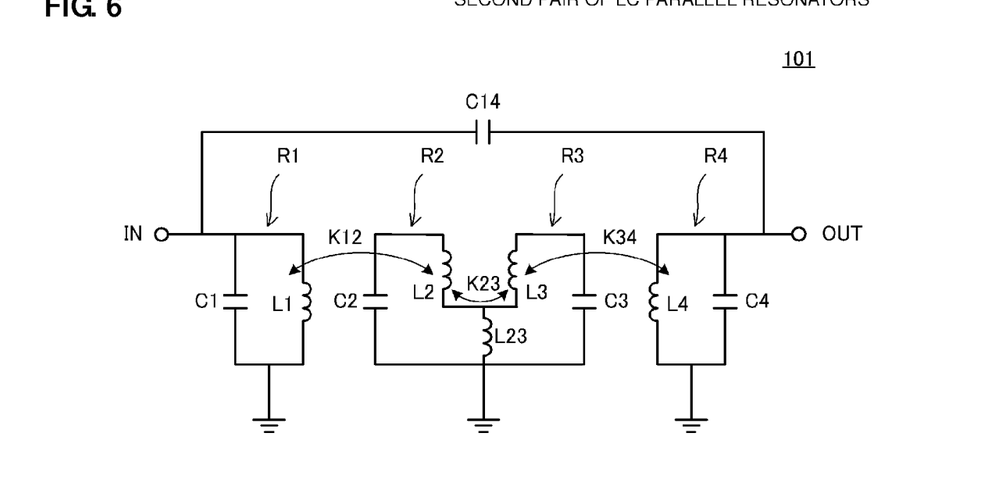
FIG. 6 is an equivalent circuit diagram of the multilayer band pass filter 101 according to the first preferred embodiment of the present invention.

FIG. 6 is an equivalent circuit diagram of the multilayer band pass filter 101 according to the first preferred embodiment of the present invention. The relationship between the configuration illustrated in FIG. 3 and the individual circuit elements in FIG. 6 will be described below.

An inductor L1 is an inductor defined by the via-electrodes V11 and V12 and the strip electrodes S11 and S12. An inductor L2 is an inductor defined by the via-electrodes V21 and V22 and the strip electrodes S21 and S22. An inductor L3 is an inductor defined by the via-electrodes V31 and V32 and the strip electrodes S31 and S32. An inductor L4 is an inductor defined by the via-electrodes V41 and V42 and the strip electrodes S41 and S42.

A capacitor C1 is a capacitor defined between the capacitor electrode P10 and the ground electrode G2. A capacitor C4 is a capacitor defined between the capacitor electrode P40 and the ground electrode G2. A capacitor C2 is a capacitor defined between the capacitor electrodes P21 and P22, and the capacitor electrode P20 and the ground electrode G3. A capacitor C3 is a capacitor defined between the capacitor electrodes P31 and P32, and the capacitor electrode P30 and the ground electrode G3.

An inductor L23 is an inductor defined by the via-electrode V23 and the strip electrode S23. A jump-coupling capacitor C14 is a capacitor defined by the capacitor electrodes P141, P142, P411, P412, and P14.

The inductor L1 and the capacitor C1 define the first-stage LC parallel resonator R1, the inductors L2 and L23 and the capacitor C2 define the second-stage LC parallel resonator R2, the inductors L3 and L23 and the capacitor C3 define the third-stage LC parallel resonator R3, and the inductor L4 and the capacitor C4 define the fourth-stage LC parallel resonator R4.

The first-stage LC parallel resonator R1 and the second-stage LC parallel resonator R2 are preferably inductively or capacitively coupled to each other as indicated by K12, and the third-stage LC parallel resonator R3 and the fourth-stage LC parallel resonator R4 are inductively or capacitively coupled to each other as indicated by K34. The second-stage LC parallel resonator R2 and the third-stage LC parallel resonator R3 are preferably inductively coupled to each other via the inductor L23 as indicated by K23. Furthermore, the first-stage LC parallel resonator R1 and the fourth-stage LC parallel resonator R4 achieve jump coupling via the jump-coupling capacitor C14.

Figure 7:
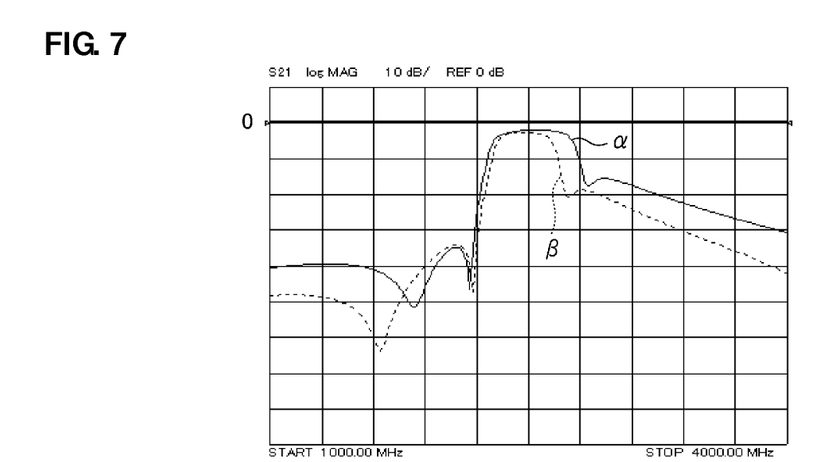
FIG. 7 is a diagram illustrating transmission characteristics (S21 characteristics of an S parameter) of the multilayer band pass filter 101 according to the first preferred embodiment of the present invention and a multilayer band pass filter according to the related art.

FIG. 7 is a diagram illustrating transmission characteristics (S21 characteristics of an S parameter) of the multilayer band pass filter 101 according to the first preferred embodiment of the present invention and a multilayer band pass filter according to the related art. In FIG. 7, a curve α represents the characteristic of the multilayer band pass filter according to the first preferred embodiment, and a curve β represents the characteristic of the multilayer band pass filter according to the related art. Here, the multilayer band pass filter according to the related art is a multilayer band pass filter having the structure illustrated in FIG. 1.

In the multilayer band pass filter 101 according to the first preferred embodiment, the first-stage and third-stage LC parallel resonators, which are not adjacent to each other in the equivalent circuit, can be arranged adjacent to each other, and the second-stage and fourth-stage LC parallel resonators, which are not adjacent to each other in the equivalent circuit, can be arranged adjacent to each other. Accordingly, the strength of coupling between the first-stage and third-stage LC parallel resonators, and the strength of coupling between the second-stage and fourth-stage LC parallel resonators can be increased, and thus the pass band width can be increased as illustrated in FIG. 7.

Second Preferred Embodiment

A multilayer band pass filter according to a second preferred embodiment of the present invention will be described with reference to FIGS. 8 to 11.

Figure 8:
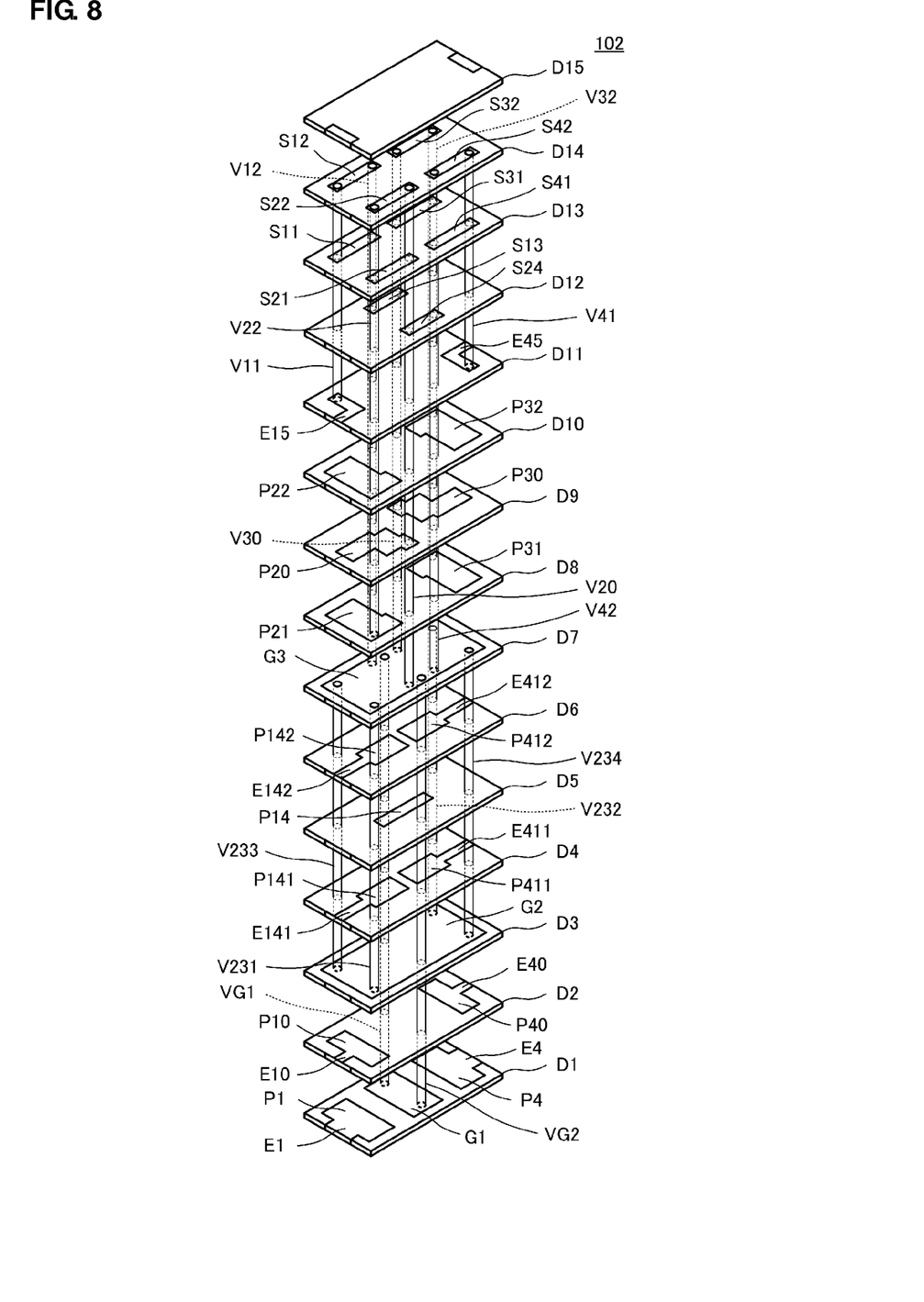
FIG. 8 is an exploded perspective view of a multilayer band pass filter 102 according to a second preferred embodiment of the present invention.

FIG. 8 is an exploded perspective view of a multilayer band pass filter 102 according to the second preferred embodiment of the present invention. The difference between the multilayer band pass filter 102 and the multilayer band pass filter 101 according to the first preferred embodiment illustrated in FIG. 3 is that there is no inductor provided to couple the second-stage LC parallel resonator and the third-stage LC parallel resonator, and that an inductor arranged to couple the first-stage LC parallel resonator and the third-stage LC parallel resonator and an inductor arranged to couple the second-stage LC parallel resonator and the fourth-stage LC parallel resonator are provided.

Strip electrodes S13 and S24 are preferably arranged on the dielectric layer D12. The via-electrodes V12, V20, V30, and V42 are preferably arranged on the dielectric layers D8 to D14. The first ends of the strip electrodes S11 and S12 are connected to the ground electrode G3 through the via-electrode V12. The first ends of the strip electrodes S21 and S22 are connected to the ground electrode G3 through the via-electrode V20. The first ends of the strip electrodes S31 and S32 are connected to the ground electrode G3 through the via-electrode V30. The first ends of the strip electrodes S41 and S42 are connected to the ground electrode G3 through the via-electrode V42. The first end of the strip electrode S13 is connected to the via-electrode V12, and the second end of the strip electrode S13 is connected to the via-electrode V20. Also, the first end of the strip electrode S24 is connected to the via-electrode V42, and the second end of the strip electrode S24 is connected to the via-electrode V20.

Figure 9:
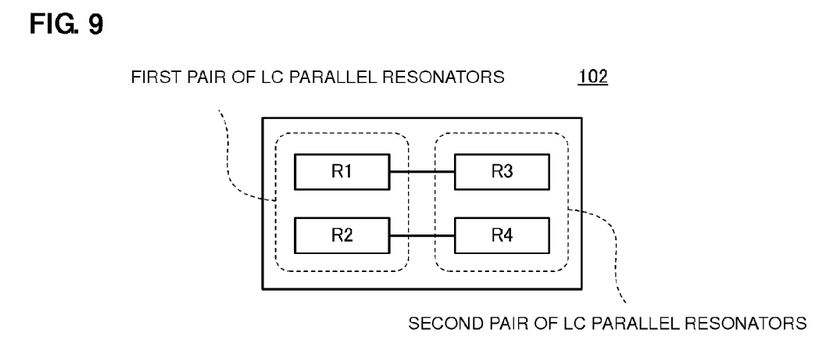
FIG. 9 is a schematic plan view illustrating the positional relationship among four LC parallel resonators of the multilayer band pass filter 102 illustrated in FIG. 8.

FIG. 9 is a schematic plan view illustrating the positional relationship among the four LC parallel resonators of the multilayer band pass filter 102 illustrated in FIG. 8. The positional relationship among the first-stage LC parallel resonator R1, the second-stage LC parallel resonator R2, the third-stage LC parallel resonator R3, and the fourth-stage LC parallel resonator R4 is preferably the same as that of the multilayer band pass filter 101 according to the first preferred embodiment. In the multilayer band pass filter 102 according to the second preferred embodiment, the first-stage LC parallel resonator R1 and the third-stage LC parallel resonator R3 are preferably inductively coupled to each other via the strip electrode S13, and the second-stage LC parallel resonator R2 and the fourth-stage LC parallel resonator R4 are preferably inductively coupled to each other via the strip electrode S24.

Figure 10:
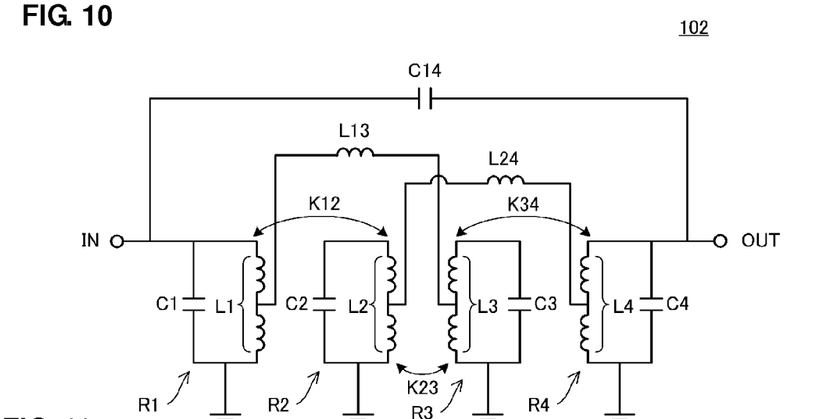
FIG. 10 is an equivalent circuit diagram of the multilayer band pass filter 102 according to the second preferred embodiment of the present invention.

FIG. 10 is an equivalent circuit diagram of the multilayer band pass filter 102 according to the second preferred embodiment of the present invention. The relationship between the configuration illustrated in FIG. 8 and the individual circuit elements in FIG. 10 will be described below.

The configuration of the LC parallel resonators R1 to R4 is preferably the same as in the first preferred embodiment. That is, the inductor L1 is an inductor defined by the via-electrodes V11 and V12 and the strip electrodes S11 and S12. The inductor L2 is an inductor defined by the via-electrodes V21 and V22 and the strip electrodes S21 and S22. The inductor L3 is an inductor defined by the via-electrodes V31 and V32 and the strip electrodes S31 and S32. The inductor L4 is an inductor defined by the via-electrodes V41 and V42 and the strip electrodes S41 and S42.

The capacitor C1 is a capacitor defined between the capacitor electrode P10 and the ground electrode G2. The capacitor C4 is a capacitor defined between the capacitor electrode P40 and the ground electrode G2. The capacitor C2 is a capacitor defined between the capacitor electrodes P21 and P22, and the capacitor electrode P20 and the ground electrode G3. The capacitor C3 is a capacitor defined between the capacitor electrodes P31 and P32, and the capacitor electrode P30 and the ground electrode G3.

An inductor L13 is preferably defined by the strip electrode S13. An inductor L24 is preferably defined by the strip electrode S24. The jump-coupling capacitor C14 is preferably defined by the capacitor electrodes P141, P142, P411, P412, and P14.

The inductor L1 and the capacitor C1 define the first-stage LC parallel resonator R1, the inductor L2 and the capacitor C2 define the second-stage LC parallel resonator R2, the inductor L3 and the capacitor C3 define the third-stage LC parallel resonator R3, and the inductor L4 and the capacitor C4 define the fourth-stage LC parallel resonator R4.

The first-stage LC parallel resonator R1 and the second-stage LC parallel resonator R2 are preferably inductively or capacitively coupled to each other as indicated by K12, the second-stage LC parallel resonator R2 and the third-stage LC parallel resonator R3 are preferably inductively or capacitively coupled to each other as indicated by K23, and the third-stage LC parallel resonator R3 and the fourth-stage LC parallel resonator R4 are preferably inductively or capacitively coupled to each other as indicated by K34. Also, the first-stage LC parallel resonator R1 and the third-stage LC parallel resonator R3 are preferably inductively coupled to each other via the inductor L13. The second-stage LC parallel resonator R2 and the fourth-stage LC parallel resonator R4 are preferably inductively coupled to each other via the inductor L24. Furthermore, the first-stage LC parallel resonator R1 and the fourth-stage LC parallel resonator R4 achieve jump coupling via the jump-coupling capacitor C14.

Figure 11:
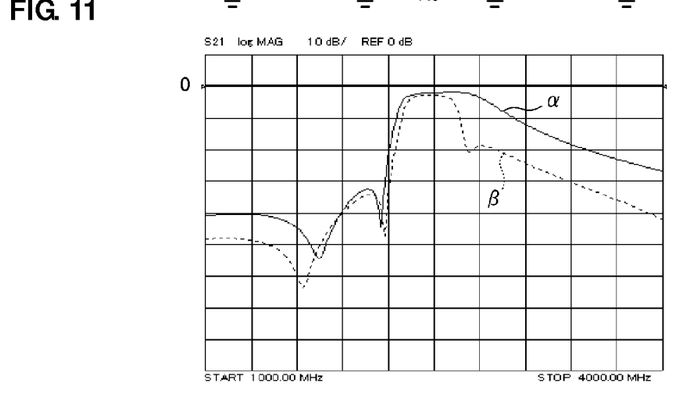
FIG. 11 is a diagram illustrating transmission characteristics (S21 characteristics of an S parameter) of the multilayer band pass filter 102 according to the second preferred embodiment of the present invention and a multilayer band pass filter according to the related art.

FIG. 11 is a diagram illustrating transmission characteristics (S21 characteristics of an S parameter) of the multilayer band pass filter 102 according to the second preferred embodiment and a multilayer band pass filter according to the related art. In FIG. 11, a curve α represents the characteristic of the multilayer band pass filter according to the second preferred embodiment, and a curve β represents the characteristic of the multilayer band pass filter according to the related art. Here, the multilayer band pass filter according to the related art is a multilayer band pass filter having the structure illustrated in FIG. 1.

In the multilayer band pass filter 102 according to the second preferred embodiment, the strength of coupling between the first-stage and third-stage LC parallel resonators, and the strength of coupling between the second-stage and fourth-stage LC parallel resonators can be increased, as in the first preferred embodiment, and thus the pass band width can be increased as illustrated in FIG. 11.

Third Preferred Embodiment

A multilayer band pass filter according to a third preferred embodiment of the present invention will be described with reference to FIGS. 12 to 14.

Figure 12:
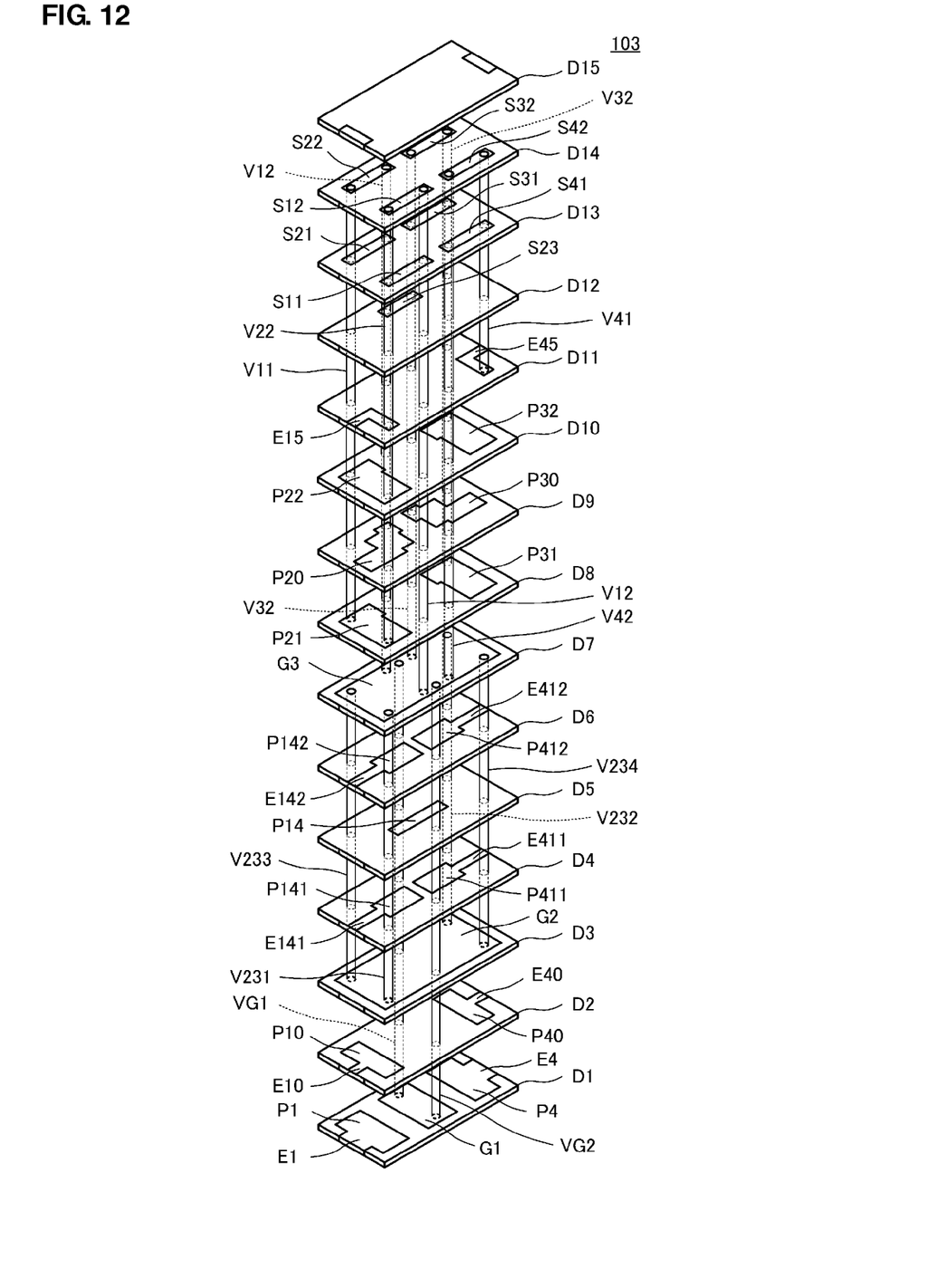
FIG. 12 is an exploded perspective view of a multilayer band pass filter 103 according to a third preferred embodiment of the present invention.
Figure 13:
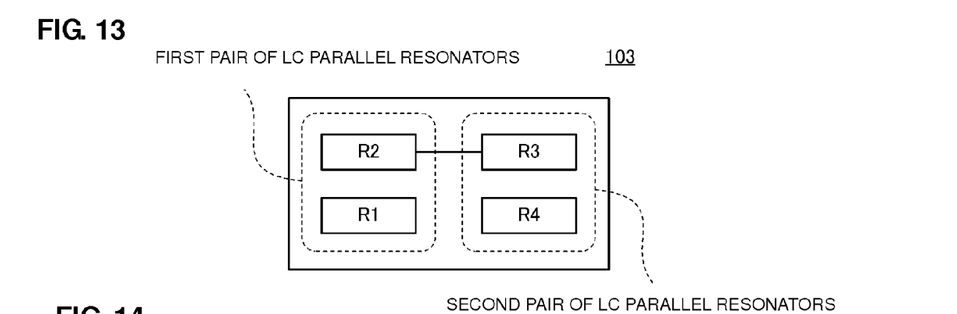
FIG. 13 is a schematic plan view illustrating the positional relationship among four LC parallel resonators of the multilayer band pass filter 103.

FIG. 12 is an exploded perspective view of a multilayer band pass filter 103 according to the third preferred embodiment of the present invention. FIG. 13 is a schematic plan view illustrating the positional relationship among the fourth LC parallel resonators of the multilayer band pass filter 103. The positional relationship between the first-stage LC parallel resonator R1 and the second-stage LC parallel resonator R2 is preferably opposite to that in the multilayer band pass filters 101 and 102 according to the first and second preferred embodiments. The positional relationship between the third-stage LC parallel resonator R3 and the fourth-stage LC parallel resonator R4 is preferably the same as that in the multilayer band pass filters 101 and 102 according to the first and second preferred embodiments. In the multilayer band pass filter 103 according to the third preferred embodiment, the second-stage LC parallel resonator R2 and the third-stage LC parallel resonator R3 are preferably coupled to each other via an inductor.

In the multilayer band pass filter 101 according to the first preferred embodiment illustrated in FIG. 3, the crank-shaped strip electrode S23 is arranged on the dielectric layer D12. In the third preferred embodiment, the positional relationship between the first-stage LC parallel resonator and the second-stage LC parallel resonator is opposite, and thus a linear strip electrode S23 is preferably arranged on the dielectric layer D12 as illustrated in FIG. 12. Also, since the positional relationship between the first-stage LC parallel resonator and the second-stage LC parallel resonator is opposite, the shapes of the individual electrodes arranged on the dielectric layers D8 to D11 are slightly different, but the basic configuration is preferably the same as that of the first preferred embodiment.

Figures 14, 15:
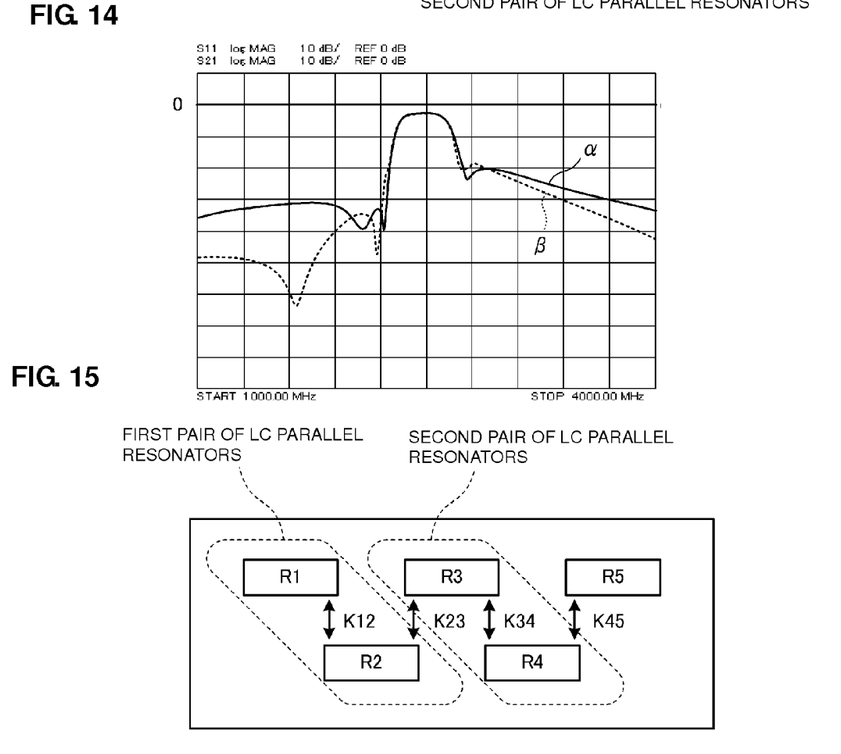
FIG. 14 is a diagram illustrating transmission characteristics (S21 characteristics of S parameter) and reflection characteristics (S11 characteristics of S parameter) of the multilayer band pass filter 103 according to the third preferred embodiment of the present invention and a multilayer band pass filter according to the related art.
FIG. 15 is a schematic plan view illustrating the positional relationship among five LC parallel resonators of a multilayer band pass filter according to a fourth preferred embodiment of the present invention.

FIG. 14 is a diagram illustrating transmission characteristics (S21 characteristics of S parameter) of the multilayer band pass filter 103 according to the third preferred embodiment and a multilayer band pass filter according to the related art. In FIG. 14, a curve α represents the transmission characteristic of the multilayer band pass filter according to the third preferred embodiment, and a curve β represents the transmission characteristic of the multilayer band pass filter according to the related art.

In the multilayer band pass filter 103 according to the third preferred embodiment of the present invention, the first-stage LC parallel resonator and the fourth-stage LC parallel resonator are the closest to each other in the arrangement direction of the pairs of LC parallel resonators. Thus, the strength of coupling between the LC parallel resonator of input (first stage) and the LC parallel resonator of output (fourth stage) can be increased. Therefore, as illustrated in FIG. 14, the attenuation characteristic on the low-frequency side is steep, compared to the multilayer band pass filter having the configuration according to the related art. Here, the multilayer band pass filter according to the related art is a multilayer band pass filter having the structure illustrated in FIG. 1.

Fourth Preferred Embodiment

FIG. 15 is a schematic plan view illustrating the positional relationship among five LC parallel resonators of a multilayer band pass filter according to a fourth preferred embodiment of the present invention. The first-stage LC parallel resonator R1 and the second-stage LC parallel resonator R2 define a first pair of LC parallel resonators, and the third-stage LC parallel resonator R3 and the fourth-stage LC parallel resonator R4 define a second pair of LC parallel resonators.

In the first pair of LC parallel resonators, the loop surfaces of the individual inductor electrodes of one LC parallel resonator (the first-stage LC parallel resonator R1) and the other LC parallel resonator (the second-stage LC parallel resonator R2) partially face each other. Likewise, in the second pair of LC parallel resonators, the loop surfaces of the individual inductor electrodes of one LC parallel resonator (the third-stage LC parallel resonator R3) and the other LC parallel resonator (the fourth-stage LC parallel resonator R4) partially face each other. Thus, the first-stage LC parallel resonator R1 and the second-stage LC parallel resonator R2 are coupled to each other at a certain coupling degree K12, and the third-stage LC parallel resonator R3 and the fourth-stage LC parallel resonator R4 are coupled to each other at a certain coupling degree K34.

Also, the loop surfaces of the individual inductor electrodes of one LC parallel resonator in the first pair (the second-stage LC parallel resonator R2) and one LC parallel resonator in the second pair (the third-stage LC parallel resonator R3) partially face each other. Furthermore, the loop surfaces of the individual inductor electrodes of the other LC parallel resonator in the second pair (the fourth-stage LC parallel resonator R4) and the other LC parallel resonator (the fifth-stage LC parallel resonator R5) partially face each other. Thus, the second-stage LC parallel resonator R2 and the third-stage LC parallel resonator R3 are coupled to each other at a certain coupling degree K23, and the fourth-stage LC parallel resonator R4 and the fifth-stage LC parallel resonator R5 are coupled to each other at a certain coupling degree K45.

In this way, resonators in adjacent pairs of LC parallel resonators can be electromagnetically coupled to each other to acquire desired characteristics without providing an inductor or capacitor for coupling.

Fifth Preferred Embodiment

Figure 16:
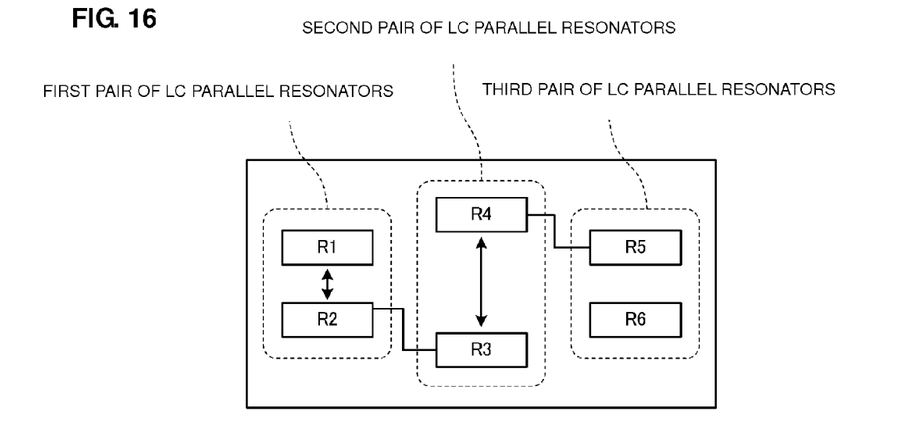
FIG. 16 is a schematic plan view illustrating the positional relationship among six LC parallel resonators of a multilayer band pass filter according to a fifth preferred embodiment of the present invention.

FIG. 16 is a schematic plan view illustrating the positional relationship among six LC parallel resonators of a multilayer band pass filter according to a fifth preferred embodiment of the present invention. The first-stage LC parallel resonator R1 and the second-stage LC parallel resonator R2 define a first pair of LC parallel resonators, the third-stage LC parallel resonator R3 and the fourth-stage LC parallel resonator R4 define a second pair of LC parallel resonators, and the fifth-stage LC parallel resonator R5 and the sixth-stage LC parallel resonator R6 define a third pair of LC parallel resonators.

In this example, the distance between the LC parallel resonators in the first pair is preferably different from the distance between the LC parallel resonators in the second pair. Also, the distance between the LC parallel resonators in the second pair is preferably different from the distance between the LC parallel resonators in the third pair. In this way, the distance between LC parallel resonators may be different between two adjacent pairs of LC parallel resonators. With this structure, the coupling degree between LC parallel resonators can be easily defined in accordance with the distance between the LC parallel resonators. Thus, the attenuation characteristic of the filter can be defined at a high degree of freedom.

Figure 17A:
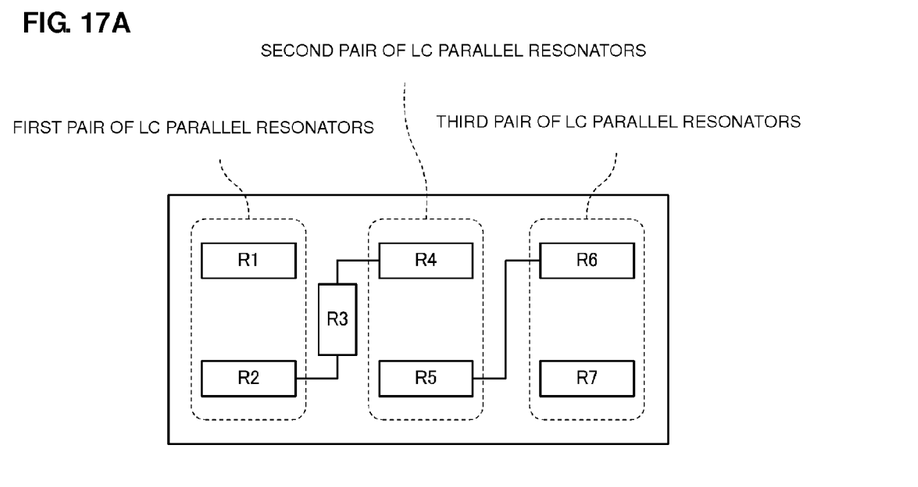
In FIGS. 17A and 17B are schematic plan views each illustrating the positional relationship among seven LC parallel resonators of a multilayer band pass filter according to a sixth preferred embodiment of the present invention.
Figure 17B:
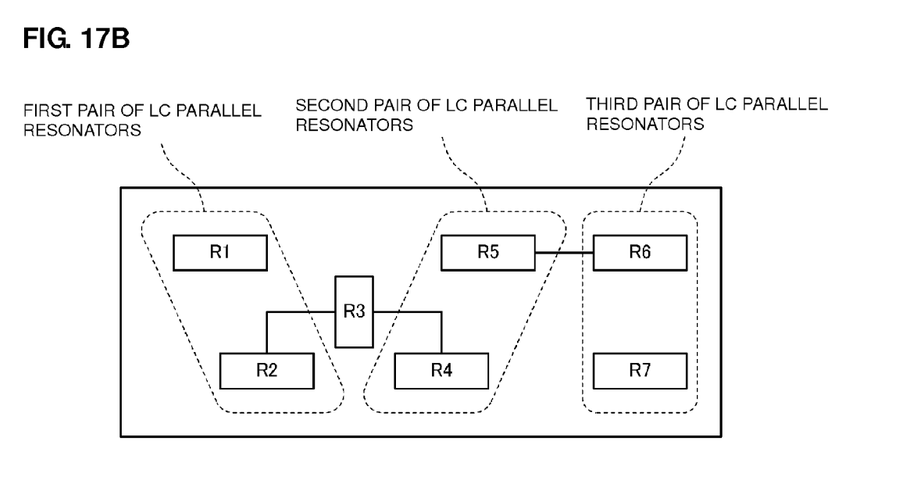

FIGS. 17A and 17B which are schematic plan views each illustrating the positional relationship among seven LC parallel resonators of a multilayer band pass filter according to a sixth preferred embodiment of the present invention. In both of the examples illustrated in FIGS. 17A and 17B, the first-stage LC parallel resonator R1 and the second-stage LC parallel resonator R2 define a first pair of LC parallel resonators, the fourth-stage LC parallel resonator R4 and the fifth-stage LC parallel resonator R5 define a second pair of LC parallel resonators, and the sixth-stage LC parallel resonator R6 and the seventh-stage LC parallel resonator R7 define a third pair of LC parallel resonators. The third-stage LC parallel resonator R3 is preferably disposed between the first pair of LC parallel resonators and the second pair of LC parallel resonators.

In this way, an LC parallel resonator may be disposed between adjacent pairs of LC parallel resonators.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer band pass filter comprising:
    a multilayer body including a plurality of dielectric layers and a plurality of electrode layers; wherein
    the plurality of electrode layers define a first capacitor electrode, a second capacitor electrode which faces the first capacitor electrode, and a loop-shaped inductor electrode which includes a first end and a second end, the first end being connected to the first capacitor electrode, the second end being connected to the second capacitor electrode, the first end defining a start point of the loop-shaped inductor electrode, and the second end defining an end point of the loop-shaped inductor electrode;
    the inductor electrode being defined by strip electrodes which are arranged along the dielectric layers and via-electrodes which extend in a stacking direction of the dielectric layers;
    the first capacitor electrode, the second capacitor electrode, and the inductor electrode define an LC parallel resonator;
    the multilayer band pass filter includes a plurality of the LC parallel resonators, the plurality of the LC parallel resonators including four or more LC parallel resonators; and
    the plurality of LC parallel resonators define a plurality of pairs of LC parallel resonators, each of the plurality of pairs of LC parallel resonators is defined by adjacent LC parallel resonators whose loop surfaces of the inductor electrodes face each other at least partially, and the plurality of pairs of LC parallel resonators are arranged in a direction parallel or substantially parallel to the loop surfaces.

2. The multilayer band pass filter according to claim 1, wherein the plurality of pairs of LC parallel resonators are arranged adjacent to one another in a line.

3. The multilayer band pass filter according to claim 1, wherein, in two adjacent pairs of LC parallel resonators among the plurality of pairs of LC parallel resonators, loop surfaces of the inductor electrodes of one LC parallel resonator in one of the two adjacent pairs and one LC parallel resonator in the other pair at least partially face each other.

4. The multilayer band pass filter according to claim 1, wherein, in two adjacent pairs of LC parallel resonators among the plurality of pairs of LC parallel resonators, a distance between the LC parallel resonators in one of the two adjacent pairs is different from a distance between the LC parallel resonators in the other pair.

5. The multilayer band pass filter according to claim 1, wherein
    in two adjacent pairs of LC parallel resonators among the plurality of pairs of LC parallel resonators, a distance between the LC parallel resonators in one of the two adjacent pairs is the same as a distance between the LC parallel resonators in the other pair; and
    in the two adjacent pairs of LC parallel resonators, loop surfaces of the inductor electrodes of one of the LC parallel resonators are arranged on the same plane, and loop surfaces of the inductor electrodes of another of the LC parallel resonators are arranged on the same plane.

6. The multilayer band pass filter according to claim 1, wherein
    the plurality of pairs of LC parallel resonators include a first pair of LC parallel resonators and a second pair of LC parallel resonators, two LC parallel resonators of the first pair are coupled to each other to define a first-stage LC parallel resonator and a second-stage LC parallel resonator in an equivalent circuit, two LC parallel resonators of the second pair are coupled to each other to define a third-stage LC parallel resonator and a fourth-stage LC parallel resonator in the equivalent circuit; and
    two LC parallel resonators arranged in one line in an arrangement direction of the two pairs of LC parallel resonators are LC parallel resonators in stages which are not adjacent to each other in the equivalent circuit, and two LC parallel resonators arranged in the other line in the arrangement direction of the two pairs of LC parallel resonators are LC parallel resonators in stages which are not adjacent to each other in the equivalent circuit.

7. The multilayer band pass filter according to claim 6, wherein the two LC parallel resonators arranged in the one line in the arrangement direction of the two pairs of LC parallel resonators are coupled to each other, and the two LC parallel resonators arranged in the other line in the arrangement direction of the two pairs of LC parallel resonators are coupled to each other.

8. The multilayer band pass filter according to claim 1, wherein a jump-coupling capacitor is connected between an input and an output of the multilayer band pass filter.

9. The multilayer band pass filter according to claim 8, wherein the jump-coupling capacitor is connected in series with ones of the plurality of LC parallel resonators which are not adjacent to one another.

10. The multilayer band pass filter according to claim 1, wherein one of the pairs of LC parallel resonators is arranged to share a series-connected inductor which is connected to ground.

11. The multilayer band pass filter according to claim 1, wherein two of the plurality of LC parallel resonators which are not adjacent to one another are inductively connected through a first coupling inductor.

12. The multilayer band pass filter according to claim 11, wherein another two of the plurality of LC parallel resonators which are not adjacent to one another are inductively connected through a second coupling inductor.

13. The multilayer band pass filter according to claim 12, wherein a jump-coupling capacitor is connected between an input and an output of the multilayer band pass filter.

14. The multilayer band pass filter according to claim 13, wherein the jump-coupling capacitor is connected in series with ones of each of the two of the plurality of LC parallel resonators and the another two of the plurality of LC parallel resonators.

15. A multilayer band pass filter comprising:
a multilayer body including a plurality of dielectric layers and a plurality of electrode layers; wherein
the plurality of electrode layers define capacitor electrodes and loop-shaped inductor electrodes;
the inductor electrodes are defined by strip electrodes which are arranged along the dielectric layers and via-electrodes which extend in a stacking direction of the dielectric layers;
the capacitor electrodes and the inductor electrodes are arranged to define a plurality of LC parallel resonators to define the multilayer band pass filter including four or more LC parallel resonators; and
the plurality of LC parallel resonators define a plurality of pairs of LC parallel resonators, each of the plurality of pairs of LC parallel resonators is defined by adjacent LC parallel resonators whose loop surfaces of the inductor electrodes face each other at least partially, and the plurality of pairs of LC parallel resonators are arranged in a direction parallel or substantially parallel to the loop surfaces.

16. The multilayer band pass filter according to claim 15, wherein the plurality of pairs of LC parallel resonators are arranged adjacent to one another in a line.

17. The multilayer band pass filter according to claim 15, wherein, in two adjacent pairs of LC parallel resonators among the plurality of pairs of LC parallel resonators, loop surfaces of the inductor electrodes of one LC parallel resonator in one of the two adjacent pairs of LC parallel resonators and one LC parallel resonator in the other of the two adjacent pairs of LC parallel resonators at least partially face each other.

18. The multilayer band pass filter according to claim 15, wherein, in two adjacent pairs of LC parallel resonators among the plurality of pairs of LC parallel resonators, a distance between the LC parallel resonators in one of the two adjacent pairs of LC parallel resonators is different from a distance between the LC parallel resonators in the other of the two adjacent pairs of LC parallel resonators.

19. The multilayer band pass filter according to claim 15, wherein
in two adjacent pairs of LC parallel resonators among the plurality of pairs of LC parallel resonators, a distance between the LC parallel resonators in one of the two adjacent pairs of LC parallel resonators is the same as a distance between the LC parallel resonators in the other of the two adjacent pairs of LC parallel resonators; and
in the two adjacent pairs of LC parallel resonators, loop surfaces of the inductor electrodes of one LC parallel resonators are arranged on the same plane, and loop surfaces of the inductor electrodes of the other LC parallel resonators are arranged on the same plane.

20. The multilayer band pass filter according to claim 15, wherein
the plurality of pairs of LC parallel resonators include a first pair of LC parallel resonators and a second pair of LC parallel resonators, two LC parallel resonators of the first pair are coupled to each other to define a first-stage LC parallel resonator and a second-stage LC parallel resonator in an equivalent circuit, two LC parallel resonators of the second pair are coupled to each other to define a third-stage LC parallel resonator and a fourth-stage LC parallel resonator in the equivalent circuit; and
two LC parallel resonators arranged in one line in an arrangement direction of the two pairs of LC parallel resonators are LC parallel resonators in stages which are not adjacent to each other in the equivalent circuit, and two LC parallel resonators arranged in the other line in the arrangement direction of the two pairs of LC parallel resonators are LC parallel resonators in stages which are not adjacent to each other in the equivalent circuit.

* * * * *